(12) United States Patent
Chua et al.

(10) Patent No.: US 6,610,599 B1
(45) Date of Patent: Aug. 26, 2003

(54) REMOVAL OF METAL VEILS FROM VIA HOLES

(75) Inventors: Lay-Lay Chua, Union, NJ (US); Chun-Ting Liu, Berkeley Heights, NJ (US); Yang Yang, Morris, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 10/175,459

(22) Filed: Jun. 19, 2002

(51) Int. Cl.⁷ .............................. H01L 21/44; C11D 9/04
(52) U.S. Cl. ..................... 438/677; 134/1.3; 510/175
(58) Field of Search ..................... 438/677; 134/1.3; 510/175

(56) References Cited

U.S. PATENT DOCUMENTS

| | | | | |
|---|---|---|---|---|
| 5,560,857 A | * | 10/1996 | Sakon et al. ................ | 510/175 |
| 5,863,344 A | * | 1/1999 | Nam ........................... | 134/1.3 |
| 6,068,788 A | * | 5/2000 | Kezuka et al. .............. | 252/79.1 |
| 6,296,714 B1 | * | 10/2001 | Matsuo et al. ................ | 134/2 |
| 6,399,504 B1 | * | 6/2002 | Lee et al. .................... | 438/705 |
| 6,413,923 B2 | * | 7/2002 | Honda et al. ................ | 510/175 |
| 6,450,181 B1 | * | 9/2002 | Morita et al. ................ | 134/1.3 |

FOREIGN PATENT DOCUMENTS

GB  2 323 850 A  * 10/1998  ......... H01L/21/306

* cited by examiner

*Primary Examiner*—T. N. Quach
(74) *Attorney, Agent, or Firm*—John F. McCabe

(57) ABSTRACT

A method for making an ICD or MEOD structure includes dry etching a structure to produce one or more via holes in an upper layer of the structure. The dry etching step stops on a metal layer that underlies the upper layer in the structure. The method also includes cleaning the dry etched structure with an aqueous solution that includes hydrogen peroxide and either an ammonium salt or an amine salt.

16 Claims, 4 Drawing Sheets

REMOVAL OF METAL VEILS FROM VIA HOLES

BACKGROUND

1. Field of the Invention

This invention relates generally to integrated circuits and monolithic electro-optical devices and, more particularly, to the fabrication of via holes.

2. Discussion of the Related Art

The fabrication of integrated circuit devices (ICDs) and monolithic electro-optical devices (MEODs) relies heavily on dry etching to produce structural features. One structural feature produced by dry etching is the via hole. Production of a via hole is the starting point for making an electrical contact to a buried metallization layer.

Dry etch processes leave residues in via holes, because energetic etchant ions sputter up atoms from underlying layers. If the dry etch stops on an underlying metallization layer, the ions of the etchant will sputter up metal particles, and the metal particles can then produce a metal veil along the walls of the produced via hole. Such a metal veil can impede subsequent formation of a high quality electrical contact in the via hole. In particular, collapse of the metal veil can partially block the via hole. This collapse causes an unpredictable contact resistance between a metal plug, which is subsequently formed in the via hole, and the underlying metallization layer. Since metal veils interfere with producing the types of high quality electrical contacts that are needed in ICDs and MEODs, it is desirable to eliminate such metal veils. While a careful selection of operating parameters of dry etches enables one to reduce metal veil formation, parameter selections do not completely eliminate veil formation. For that reason, it is desirable to have methods for cleaning metal veils from via holes.

SUMMARY

Various embodiments provide methods for cleaning metal veils from via holes that are produced when a dry etch stops on a metal layer. Though these cleaning methods use reactive species that can damage dielectrics and/or mask resists, the cleaning methods avoid such damage by maintaining concentrations of the reactive species low during veil cleaning. Thus, the new cleaning methods do not cause incidental damage that would otherwise result if metal veils were removed with conventional cleaning solutions that are based on the same reactive species.

In one aspect, the invention features a method that includes performs a dry etch to produce one or more via holes in an upper layer of a structure. The dry etching stops on a metal layer that underlies the upper layer in the structure. The method includes cleaning the dry etched structure with an aqueous solution of hydrogen peroxide and either an ammonium salt or an amine salt.

In another aspect, the invention features an aqueous solution that includes hydrogen peroxide and either an ammonium salt or an amine salt. The aqueous the solution has a pH between about 4 and about 9.

DETAILED DESCRIPTION OF EMBODIMENTS

Figure 1:
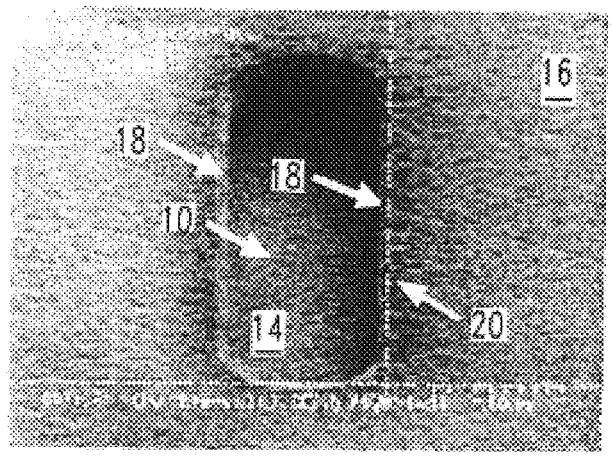
FIG. 1 shows an intermediate ICD or MEOD structure with a metal veil that was produced by sputtering of metal atoms during a reactive ion etch (RIE)

FIG. 1 is a top view of an intermediate ICD or MEOD structure 8 that has a hole 10. The via hole 10 was made by performing inductively coupled plasma (ICP)-reactive ion etch (RIE) through a dielectric layer and stopping the ICP-RIE on an underlying metal layer 14. The dielectric layer includes polymerized benzo cyclobutene and is covered by an overlying layer 16 of mask resist. The underlying metal layer 14 is a multi-layer that includes, i.e., from top-to-bottom, a 5 nanometer (nm) thick palladium (Pd) cap, a 35 nm thick layer of platinum (Pt), a 650 nm thick layer of gold (Au), and a 40 nm thick layer of Pd.

During the ICP-RIE, reactive ions sputtered heavy metal atoms out of top layers of metal layer 14. A portion of the sputtered heavy metal atoms have produced porous metal veil 18, i.e., a thin layer. The metal veil 18 lines vertical walls 20 of the hole 10, which traverses both a dielectric layer and the layer 16 of mask resist. The metal veil 18 is fragile and only weakly attached to the walls 20 of the hole 10. Due to its fragileness and weak attachment, subsequent processing easily damages the metal veil 18. In particular, removal of the layer 16 of mask resist can damage the fragile metal veil 18.

Figure 2A:
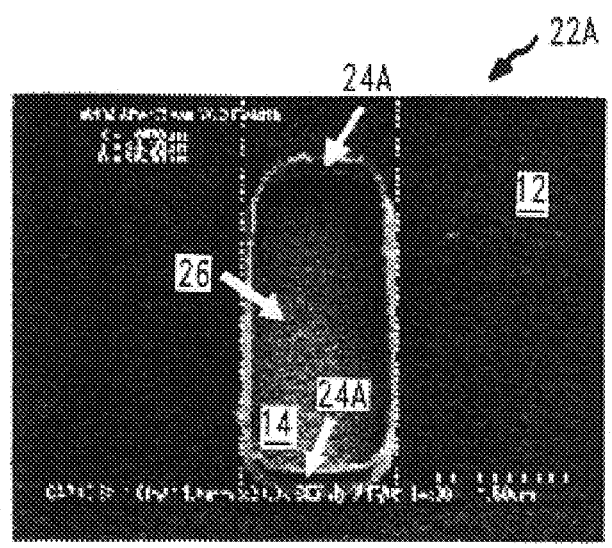
FIG. 2A shows a metal veil that remains after removal of the mask resist that controlled a RIE.

FIG. 2A is a top view of an exemplary structure 22A that was produced by further processing of a dry etched structure similar to the intermediate structure 8 of FIG. 1. The structure 22A resulted from stripping the layer of mask resist, i.e., layer 16 of FIG. 1, that remained after the ICP-RIE. Stripping the remaining layer of mask resist produced a free-standing portion 24A of the metal veil. The free-standing portion 24A of the metal veil layer extends above edges of via hole 26 in dielectric layer 12. The free-standing portion 24A of the metal veil layer is very fragile.

Figure 2B:
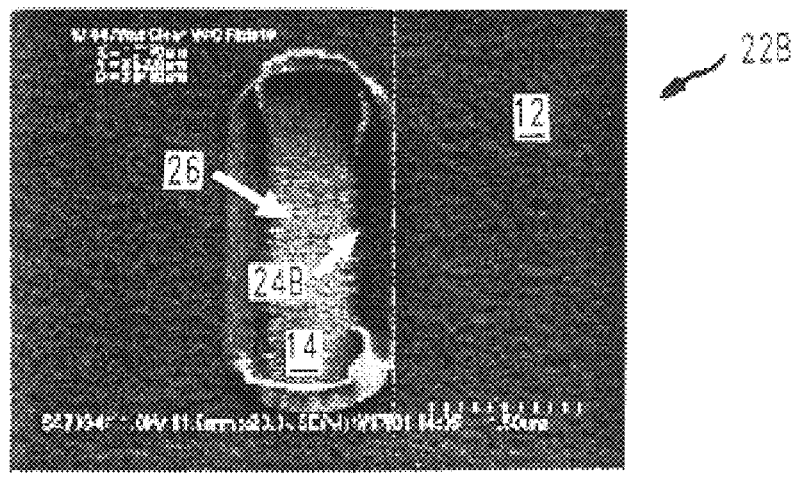
FIG. 2B shows a collapsed metal veil produced by stripping away a mask resist that controlled an RIE.

FIG. 2B is a top view of another exemplary structure 22B that was produced by further processing of a dry etched structure similar to intermediate structure 8 of FIG. 1. The structure 22B resulted from stripping the layer of mask resist, layer 16 of FIG. 1, that remained after the ICP-RIE. The stripping process again produced a free-standing portion of metal veil layer, i.e., similar to free-standing portion 24A of FIG. 2B. Due to its fragileness, the free-standing portion of the metal veil partially collapsed thereby producing collapsed veil portion 24B. The collapsed veil portion 24B fell back into the via hole 26 and covered up a portion of the metallization layer 14 at the bottom of the via hole 26.

Further processing of intermediate structures similar to structure 8 of FIG. 1 also produces other types of metal-veil residues. For example, stripping of mask resist can cause metal veils to outwardly collapse (not shown). In such cases, portions of the metal veil fall onto a top surface of the dielectric layer surrounding a via hole.

Both types of metal-veil collapse interfere with subsequent fabrication processes in ICDs and MEODs. If the collapsed portion 24B falls back into the via hole 26, as shown in FIG. 2B, the collapsed portion 24B blocks the via hole 26 and interferes with making high quality electrical contacts. In particular, later-formed metal plugs (not shown) will have a unpredictable or high contact resistances with underlying metal layer 14 due to the presence of the collapsed portion 24B between the metal plug and the underlying metal layer 14. If the collapsed portion of the metal veil falls back onto the surrounding dielectric layer (not shown), the collapsed metal veil can dent or otherwise deform the top surface of the dielectric layer, i.e., especially if the dielectric layer is a soft organic polymer. Subsequent deposition of another layer, e.g., a metallization or a dielectric layer, on the dented or deformed top surface will result in worse interlayer adhesion thereby reducing the quality and durability of the final ICD or MEOD.

Figure 4:
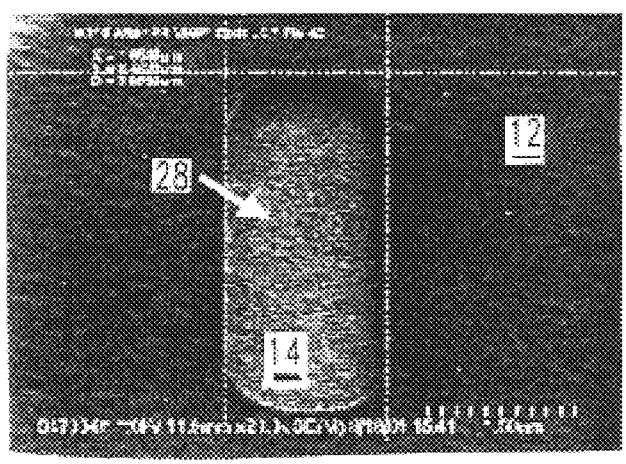
FIG. 4 shows a structure produced by cleaning a dry etched structure similar to that of FIG. 1 with the cleaning method of FIG. 3.
Figure 3:
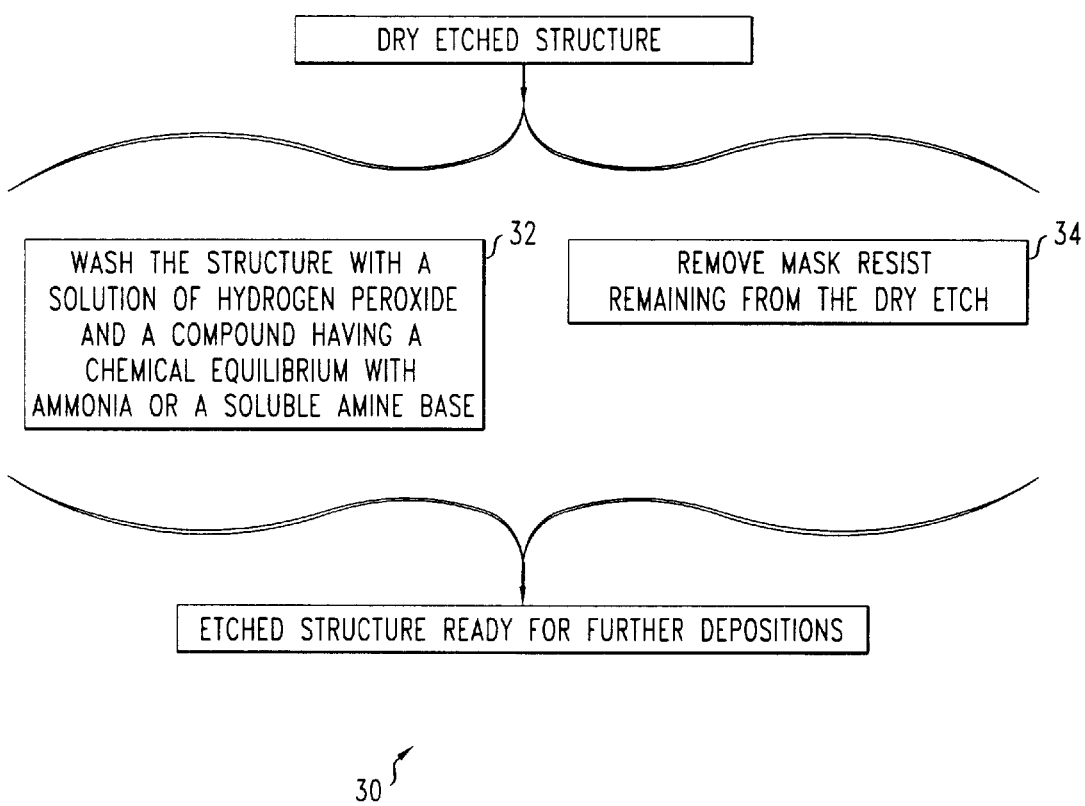
FIG. 3 is a flow chart for a method of cleaning dry etched structures.

To improve the quality of the dry etched structures used in the manufacture of ICDs and MEODs, the inventors created a method for cleaning metal veils from via holes. A flow chart for the cleaning method 30 is shown in FIG. 3. The method 30 produces a cleaned dry etched structure 29 that is shown in FIG. 4.

Method 30 includes washing the dry etched structure with an aqueous solution containing hydrogen peroxide, $H_2O_2$, and a nitrogen-bearing salt such as a soluble ammonium salt or a soluble amine salt (step 32). The nitrogen-bearing salt has a chemical equilibrium with ammonia, $NH_3$, or a soluble amine base. During the wash step, the hydrogen peroxide oxidizes metals in porous metal veils, and then, the ammonia or amine base, which is in equilibrium with the nitrogen-bearing salt, reacts with the metal oxide to produce a water soluble complex. As more ammonia or amine base reacts, the chemical equilibrium causes more of the nitrogen-bearing ions, e.g., ammonium or amine ions, from the salt to dissociate thereby replacing the reacted ammonia or soluble amine base. The dissociation reaction for the nitrogen bearing salt has a small equilibrium constant, that is, at least, less than about $10^{-7}$ under the conditions in the aqueous solution at room temperature.

The method 30 also includes removing mask resist used to control the dry etch that formed the metal veils (step 34). After the veil cleaning and mask removal steps 32 and 34, the structure is ready for further processing, e.g., forming metal plugs in via holes 28 to provide electrical contact to metal layer 14. After the veil cleaning and mask removal, the underlying metal layer 14, vertical walls of the via hole 28, and surrounding surface of dielectric layer 12 are smooth and free of residues.

If dielectric layer 12 is a soft organic polymer, the method 30 preferably includes performing cleaning step 32 prior to mask removal step 34. This step-order insures that collapse of a metal veil will not dent or otherwise damage the soft top surface of the dielectric layer 12. If veil-collapse damage to the dielectric layer 12 is not a concern, e.g., because the dielectric layer 12 is not a soft organic material, then steps 32 and 34 can be performed in any order.

The cleaning solutions of the method 30 were discovered by experimentation on known solutions for contamination and adhering particles from surfaces. The conventional solutions use strong acids or strong bases, and for that reason, react with organic materials. Since organic materials are used in modern mask resists and dielectric layers, the convention cleaning solutions can erode ICD and MOED structures and produce undesired residues on such structures. The cleaning solutions of the method 30 do not significantly react with mask resists, dielectric layers, or metal layers and thus, do not produce undesirable residues or erode features on the structures 8, 22A, 22B of FIGS. 1, 2A, and 2B.

The inventors' experiments included a study of a cleaning solution known as Standard Clean-1 (SC-1). SC-1 is described in Handbook of semiconductor wafer cleaning technology: science, Technology, and applications, Noyes publications (NJ) 1993. SC-1 is an aqueous solution of hydrogen peroxide, $H_2O_2$, and ammonia, $NH_3$. An exemplary SC-1 solution is formed by mixing deionized water, an aqueous solution of about 30 wet-weight percent (w/w%) $H_2O_2$, and an aqueous solution of about 30 w/w% $NH_3$ with respective volume ratios of 10:1:5 at room temperature.

While the experiments showed that SC-1 does remove heavy metal veils from dry etched structures, the experiments also showed that SC-1 produces undesirable residues when treatment with the SC-1 precedes removal of mask resist. The undesirable residues result from a reaction between the SC-1 and the mask resist. The residue is not easily removed by treatments, e.g., washes with strong organic solvents like acetone. The residue destroys the smoothness of outer dielectric layer and can clog via holes. For this reason, cleaning a dry etched structure with an SC-1 type solution reduces the quality of layers and/or electrical contacts that can be subsequently made on the structure.

The inventors discovered several facts relevant to the SC-1 cleaning solution. First, a reaction between the $NH_3$ component of SC-1 and mask resists is responsible for producing the undesirable residues on dry etched structures. Second, both the $NH_3$ and $H_2O_2$ components of SC-1 are important to the cleaning solution's ability to remove heavy metal veils at temperatures as low as room temperature. Third, ions of heavy metals have very high affinities for $NH_3$. Thus, under oxidative conditions, many heavy metals react with aqueous $NH_3$ much faster than mask resists. Finally, aqueous solutions of ammonia and aqueous solutions of soluble amine bases have similar reaction properties.

Based on the above facts, the inventors developed aqueous cleaning solutions that include $H_2O_2$ and a stabilized concentration of either ammonia or soluble amine base, i.e., basic $NR_3$ molecules where R-groups are selected from hydrogen, short alkyl chains, and/or hydroxyalkyl groups. Since ammonia and amine base react with both mask resists and heavy metals, their solution concentrations are stabilized at a level that is high enough to remove metal veils, but low enough to impede significant reaction with mask resist during the removal of metal veils.

The new cleaning solution has a concentration of aqueous ammonia or amine base that is much lower than the concentration $H_2O_2$. Exemplary concentrations of the ammonia or amine base in the solution are lower than the concentration of hydrogen peroxide by a factor of 10, 100 or more and preferable by a factor of about 1,000. Due to the high reactivity of porous heavy metal veils, metal veil removal still proceeds rapidly in such ammonia or amine base "starved" solutions.

Some embodiments of the new cleaning solutions are aqueous solutions of an ammonium salt. Exemplary ammonium salts include ammonium halides such as ammonium chloride, $NH_4Cl$, or ammonium bromide, $NH_4Br$. The natural acidity of the cleaning solution fixes the equilibrium between $NH_4^+$ ions and $NH_3$. In particular, the aqueous $NH_4^+$ ions disassociate to produce ammonia, $NH_3$, via the following reaction:

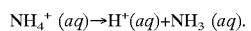

$NH_4^+$ (aq)→$H^+$(aq)+$NH_3$ (aq).

This disassociation reaction has an equilibrium constant, $K_a$, which is defined by $([H^+][NH_3]/[NH_4^+])$. At room temperature, $K_a$ is very small, i.e., about $10^{-9.4}$. The smallness of $Ka$ makes the concentration of $NH_3$ (aq) small when the ratio of the concentration of hydronium ions, $[H^+]$, to the concentration of ammonium ions, $[NH_4^+]$, is not too small. As $NH_3$ reacts with heavy metals in metal veils, more $NH_4^+$ disassociates to replenish the lost $NH_3$ and maintain the $NH_3$ concentration at a relatively stable low value.

An exemplary cleaning solution is made by mixing deionized water, an aqueous solution of about 30 w/w% $H_2O_2$, and an aqueous solution of about 20 w/w% $NH_4Cl$ in the approximate volumetric ratios 10:1:5 at room temperature. For this solution, the ratio, R, of the equilibrium concentrations of $NH_3$ and $H_2O_2$ is:

$$R \equiv [NH_3]/[H_2O_2] = K_a[NH_4^-]/([H_2O_2][H^+])$$

For this solution, the above equation implies that preferable values of R, i.e., values about $10^{-2}$ to about $10^{-5}$, result for pH's between about 8 and about 5. These pH values result from natural hydrolysis of ammonium and amine salts, e.g., $NH_4Cl$, in water. These small values of R are preferable to avoid significant reaction of mask resist during metal veil removal.

Some embodiments of cleaning solutions create low equilibrium ammonia or amine base concentrations by pH buffering of a solution of an ammonium salt or an amine salt. In such a solution, the ammonium ions or amine ions disassociate to produce concentrations of ammonia or soluble amine base that are advantageously controlled by pH. Since ammonia and soluble amine bases cause both complexation reactions that dissolve heavy metal veils and other reactions that produce undesirable residues, e.g., from mask resists, the pH of the cleaning solution is set low enough to stop significant formation of the residues during veil removal, i.e., step 32. For solutions that include ammonium salts, a pH below 9 and preferably below about 8 stabilizes the ammonia concentration at a low enough level to avoid significant production of undesirable residues.

Other exemplary cleaning solutions based on $H_2O_2$ and $NH_4Cl$ are made by mixing deionized water, an aqueous solution of 15–60 w/w% $H_2O_2$, and an aqueous solution of 10–40 w/w% $NH_4Cl$ in volumetric ratios in the range of about 10:1:5 to about 100:1:5. The 10:1:5 volumetric mixing ratio produces a solution with about 1–4 w/w% $H_2O_2$ and about 0.6–3.5 w/w% $NH_4Cl$, and the 100:1:5 volumetric mixing ratio provides a solution with about 0.1–0.4 w/w% $H_2O_2$ and about 0.06–0.35 w/w% $NH_4Cl$.

In the new solutions, low concentrations of ammonia and/or soluble amine base are probably effective at removal of porous metal veils, because hydrogen peroxide oxidizes the heavy metals in veils to produce ions with high affinities for $NH_3$ and soluble amine base.

Figure 5:
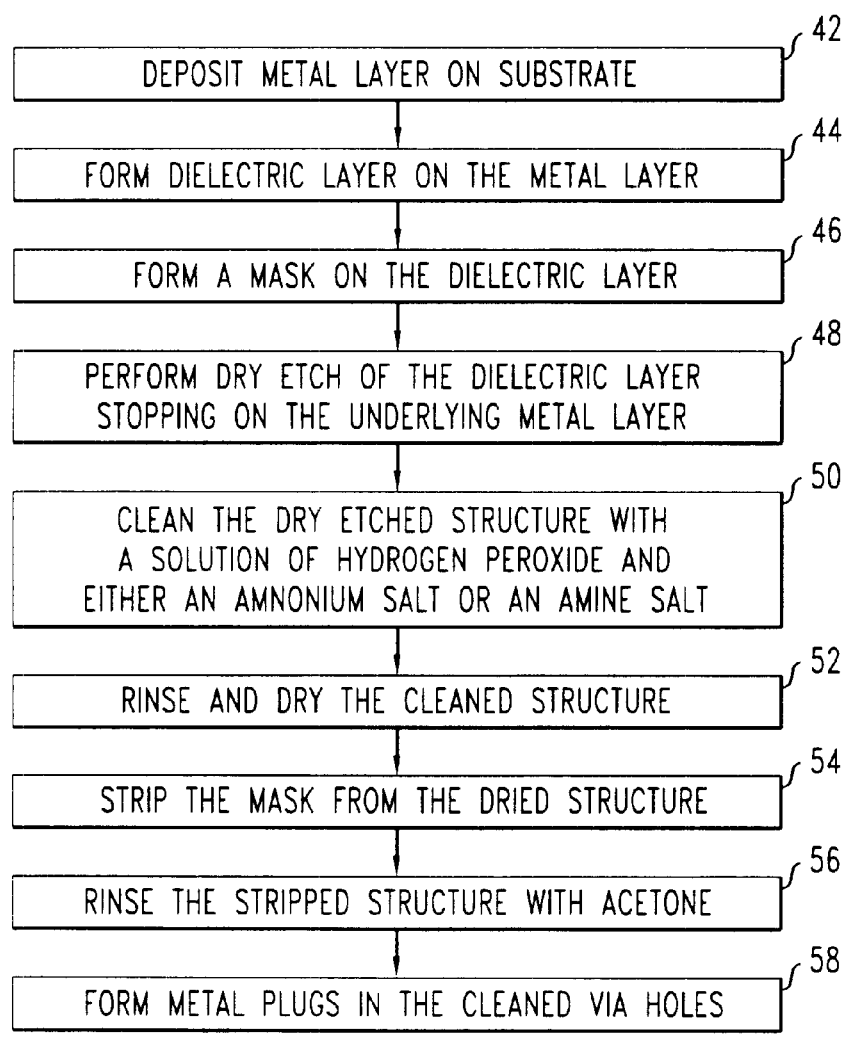
FIG. 5 is a flow chart for a method of fabricating dry etched structures without metal veils.

FIG. 5 shows a method for fabricating an ICD or MEOD. The method 40 includes depositing a metal layer on a dielectric or semiconductor substrate, e.g., an indium phosphide substrate (step 42). Exemplary metal layers include interconnect metallization layers and metal multi-layers that include heavy metals such as copper (Cu), nickel (Ni), cobalt (Co), gold (Au), palladium (Pd), or platinum (Pt). The metal layers are formed by any method known to those of skill in the art.

The method 40 also includes forming a protective dielectric layer on the metal layer (step 44). Exemplary dielectric layers are formed by spin-coating or dip-coating a film of precursor molecules, e.g., benzo cyclobutene molecules, on the metal layer and then, curing the film to produce a crosslinked dielectric layer.

The method 40 also includes forming a mask on the dielectric layer (step 46). The formation of the mask involves depositing a positive or negative photo-resist on the dielectric layer, exposing the photo-resist to a pattern of ultraviolet light, and removing either exposed or unexposed portions of the photo-resist by techniques known to those of skill in the art. A suitable positive photo-resist is available from Shipley Corporation of Ste. 101, 1457 MacArthur Rd., Whitehall Pa. 18052 under the product name SP1818. This positive photo-resist reacts with ammonia to produce residues that are difficult to clean from organic dielectrics.

The method 40 includes performing a mask-controlled dry etch of the dielectric layer to produce a structure with via holes (step 48). The via holes provide access to the underlying metal layer, because the dry etch stopped on the metal layer. Near the stopping point, the dry etch sputters up atoms from the underlying metal layer, and these metal atoms are present in etchant gases. The heavy metal atoms in the etchant gases form metal veils along sidewalls of the via holes being etched.

An exemplary device for performing the dry etch is the model SLR770 ICP-RIE Etcher made by Unaxis USA Inc. of 10050 16th Street North, St. Petersburg, Fla. 33716. Exemplary operating parameters for etching polymerized BCB with the model SLR770 etcher are: a total gas pressure of 2–10 milliTorr (mT); gas flow rates of 10–50 standard cubic centimeters (sccm) for $CF_4$, 10–40 sccm for $O_2$, and 10–20 sccm for argon (Ar); a source RF power of 100–200 watts (W); and a bias RF power 20–80 W. Preferred operating parameters for etching polymerized BCB are: a total gas pressure of about 8 mT; gas flow rates of about 20 sccm for $CF_4$, about 20 sccm for $O_2$, and about 15 sccm for Ar; a source RF power of about 180 W; and a bias RF power of about 65 W.

The method 40 includes cleaning the etched structure with a pH controlled aqueous cleaning solution that includes $H_2O_2$ and either an ammonium salt or an amine salt (step 50). In aqueous solution, ammonium ions or amine ions maintain a chemical equilibrium with ammonia, i.e., $NH_3$, or soluble amine base, respectively. The pH of the solution insures that the equilibrium produces a concentration of ammonia and soluble amine base that is low enough to stop significant reaction of the ammonia and soluble amine base with organic photo-resist or dielectric.

Cleaning step 50 involves immersing the dry etched structure in an aqueous cleaning solution for a time period sufficient to remove heavy metal veils. An exemplary cleaning solution is made by mixing deionized water with an aqueous solution of about 30 w/w% $H_2O_2$ and an aqueous solution of about 20 w/w% $NH_4Cl$ in volumetric portions of about 10:1:5 at 24° C. For the exemplary cleaning solution, an exposure of about 5 minutes at a temperature of about 55° C. to about 70° C. removes metal veils produced by an RIE that stopped on Pt.

The method 40 also includes rinsing and drying the cleaned structure (step 52). An exemplary rinse includes: a rinse of about 2 minutes in deionized water and a spin rinse in deionized water at about 300 rounds per minute (rpm) for about 20 seconds. An exemplary dry includes: blowing nitrogen gas over the rinsed structure and simultaneously spinning the structure on a centrifuge at about 3,000 rpm.

The method 40 also includes plasma stripping remaining mask resist from the dried structure (step 54). An exemplary stripper is the model 300 autoload PC plasma processor that is manufactured by TELPLA Inc. of 1321 Valwood Parkway, Suite 400, Carrollton Tex. 75006. For stripping the SP1818 positive photo-resist exemplary operating parameters for the TELPA model 300 plasma stripper are: a total gas pressure of about 0.5 mbar, a gas flow rate of about 50 sccm Ar and about 150 sccm $O_2$, and an RF power of about 200 W. The total stripping time depends on the thickness of mask resist and would be easily determined by one of skill in the art.

The method 40 includes rinsing the stripped structure with a strong organic solvent, e.g., acetone, to remove remaining organic residues (step 56). After the acetone rinse, the structure is dried, e.g., with isopropyl alcohol and a nitrogen spray.

The method 40 also includes depositing metal plugs, e.g., tungsten plugs, in the cleaned via holes of the structure (step 58). The metal plugs provide low resistance electrical contacts to the underlying metal layer and are made by any method known to those of skill in the art.

Various embodiments of fabrication methods for ICDs and MEODs repeat steps 42–58 to produce further metallization layers in the final device.

Other embodiments of the invention will be apparent to those skilled in the art from consideration of the specification, drawings, and claims.

What we claim is:

1. A method, comprising:

dry etching a structure to produce one or more via holes in an upper layer of the structure, the dry etching stopping on a metal layer that underlies the upper layer in the structure; and cleaning the dry etched structure with an aqueous solution comprising hydrogen peroxide and one of an ammonium salt and an amine salt; and wherein the one of an ammonium salt and an amine salt has an equilibrium in the aqueous solution with one of ammonia and an amine base, the concentration of the one of ammonia and an amine base in the aqueous solution being 100 or more times lower than the concentration of the hydrogen peroxide; and wherein the aqueous solution has a pH between 5 and 9.

2. The method of claim 1, wherein the cleaning removes a metal veil from a via hole formed by the dry etching.

3. The method of claim 1, wherein the concentration of the one of ammonia and an amine base is at least 1,000 times lower than the concentration of hydrogen peroxide in the solution.

4. The method of claim 1, wherein the dry etching is controlled by a mask that is deposited on the upper layer; and the method further comprises stripping the mask from the upper layer after performing the act of cleaning.

5. The method of claim 4, wherein the mask resist is a positive resist and the upper layer is an organic dielectric.

6. The method of claim 1, wherein the upper layer is a dielectric layer.

7. The method of claim 6, further comprising:

forming the aqueous solution by dissolving an ammonium halide in water.

8. The method of claim 6, wherein the ammonium halide is ammonium chloride.

9. The method of claim 6, wherein the etching stops on a metal layer that comprises one of Pd, Cu, Ni, Co. Au, and Pt.

10. The method of claim 9, wherein the etching produces a metallic veil comprising one of Pd, Cu. Ni, Co, Au, and Pt along a sidewall of a via hole.

11. A composition, comprising:

an aqueous solution comprising hydrogen peroxide and one of an ammonium salt and an amine salt; and wherein the one of an ammonium salt and an amine salt has an equilibrium in the aqueous solution with one of ammonia and an amine base, the concentration of the one of ammonia and an amine base in the aqueous solution being 100 or more times lower than the concentration of the hydrogen peroxide; and wherein the solution has a pH that is between 5 and 9.

12. The composition of claim 11, wherein the concentration of the one of ammonia and an amine base is at least 1,000 times lower than the concentration of hydrogen peroxide in the solution.

13. The composition of claim 11, wherein the aqueous solution has a pH that is less than or equal to 8.

14. The composition of claim 11, wherein the one of an ammonium salt and an amine salt is an ammonium halide.

15. The composition of claim 14, wherein the ammonium halide is ammonium chloride.

16. The composition of claim 15, wherein the solution comprises about 1 to about 4 w/w% $H_2O_2$, and about 0.6 to about 3.5 w/w% $NH_4Cl$.

* * * * *